(12) United States Patent
Park et al.

(10) Patent No.: US 8,093,705 B2
(45) Date of Patent: Jan. 10, 2012

(54) DUAL FACE PACKAGE HAVING RESIN INSULATING LAYER

(75) Inventors: Seung Wook Park, Gyunggi-do (KR); Young Do Kweon, Seoul (KR); Jingli Yuan, Gyunggi-do (KR); Seon Hee Moon, Seoul (KR); Ju Pyo Hong, Gyunggi-do (KR); Jae Kwang Lee, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 205 days.

(21) Appl. No.: 12/320,286

(22) Filed: Jan. 22, 2009

(65) Prior Publication Data

US 2010/0102426 A1    Apr. 29, 2010

(30) Foreign Application Priority Data

Oct. 27, 2008   (KR) ........................ 10-2008-0105418

(51) Int. Cl.
*H01L 23/50* (2006.01)
*H01L 21/768* (2006.01)

(52) U.S. Cl. ......... 257/686; 257/E23.079; 257/E21.576; 257/E21.507; 257/773; 257/774; 257/680; 257/737; 257/738; 257/778

(58) Field of Classification Search .................. 257/686, 257/E23.079, E21.576, 773, 774, 680, 737, 257/738, 778, 723, 777, E21.507
See application file for complete search history.

(56) References Cited

U.S. PATENT DOCUMENTS

| | | | | |
|---|---|---|---|---|
| 6,005,276 A * | 12/1999 | Forrest et al. | ................. | 257/432 |
| 6,528,732 B1 * | 3/2003 | Okubora et al. | ............. | 174/255 |
| 7,190,595 B2 * | 3/2007 | Chang | ............... | 361/816 |
| 7,326,629 B2 * | 2/2008 | Nagarajan et al. | ............. | 438/459 |
| 7,462,930 B2 * | 12/2008 | Lee et al. | ........................ | 257/686 |
| 7,768,115 B2 * | 8/2010 | Lee et al. | ........................ | 257/777 |
| 7,964,926 B2 * | 6/2011 | Kim | ............................. | 257/431 |
| 2007/0013062 A1 * | 1/2007 | Kobayashi et al. | ............. | 257/734 |
| 2009/0311828 A1 * | 12/2009 | Andry et al. | .................. | 438/107 |
| 2010/0301474 A1 * | 12/2010 | Yang | ............................. | 257/737 |

* cited by examiner

*Primary Examiner* — A O Williams (57) ABSTRACT

A dual face package includes a semiconductor substrate including a through-electrode connected to a die pad disposed on one side of the semiconductor substrate, and a lower redistribution layer disposed on another side thereof and connected to the through-electrode, an insulating layer including a post electrode connected to the through-electrode, and an upper redistribution layer disposed on one side thereof and connected to the post electrode, and an adhesive layer disposed on the one side of the semiconductor substrate so as to attach the insulating layer to the semiconductor substrate such that the through-electrode is connected to the post electrode.

8 Claims, 10 Drawing Sheets

DUAL FACE PACKAGE HAVING RESIN INSULATING LAYER

CROSS REFERENCE TO RELATED APPLICATION

This application claims the benefit of Korean Patent Application No. 10-2008-0105418, filed Oct. 27, 2008, entitled "A DUAL FACE PACKAGE AND A FABRICATION METHOD FOR THE SAME", which is hereby incorporated by reference in its entirety into this application.

BACKGROUND OF THE INVENTION

1. Field of the Invention

The present invention relates to a dual face package and a method of manufacturing the same, and more particularly to a dual face package and a method of manufacturing the same in which an upper substrate serving as a resin sealing layer is prepared in advance and the upper substrate is attached to a semiconductor substrate through an adhesive layer disposed therebetween.

2. Description of the Related Art

With increase in demand for the miniaturization and increased functionality of various electronic devices, semiconductor packages gradually have been becoming structures of high density, high performance and low cost as time goes by. Accordingly, intensive research into the manufacture of three-dimensional chip stacked packages using three-dimensional mounting technology is actively being conducted in order to realize high integration of semiconductor packages.

Three-dimensional mounting technology may be currently classified into three technologies. The first is a PoP (Package on Package) technology of stacking packages one on another, each of which includes one or more semiconductor chips, the second is a MCP (Multi Chip Package) technology of mounting a plurality of LSI chips on one package, and the third is a TSV (Through Silicon Via) technology of arranging through-electrodes in a silicon substrate of a LSI chip. It is widely maintained that development of the three-dimensional mounting technology is directed toward a three-dimensionally stackable structure which is simply configured to have a size as small as possible, which is close to the size of a chip and which is easy to test.

Particularly, since the PoP technology has an advantage in that packages are individually tested and because among all the packages only sound ones are stacked one on another, thus increasing a yield in an assembling operation, the stacked packages are being incorporated in high-performance mobile-phones.

In the field of PoP technology, because a mounting height of package is relatively high and the free arrangement of the terminals of stacked packages is restricted, reliability of connection between the packages is decreased. To overcome the above problem with the conventional PoP technology, a so-called dual face package, which enables external connecting terminals to be formed at predetermined positions on upper and lower surfaces thereof, respectively, and a method of manufacturing the dual face package are currently getting a lot of attention.

The conventional dual face package is usually manufactured in a way such that through-electrodes connected to die pads are formed in a semiconductor substrate to allow external connecting terminals to be formed at a lower surface of the package, resin sealing material such as epoxy molding compound (EMC) is transfer-molded into a resin sealing layer on the semiconductor substrate using a mold to allow external connecting terminals to be formed on an upper surface of the package, and post electrodes connected to the die pads of the semiconductor substrate are formed in the resin sealing layer.

However, according to the conventional technology, there is some difficulty in molding a resin sealing layer on a semiconductor substrate. More specifically, when a resin sealing material is formed on a semiconductor substrate through a transfer molding process for the wafer level packaging, resin sealing material which was previously injected becomes cured in the course of the transfer molding, thus making the formation of resin sealing layer on the entire area of a semiconductor substrate difficult.

Furthermore, since gas is released from a resin sealing layer which is being cured, the resin sealing layer becomes separated from a semiconductor substrate, thus deteriorating the reliability of packages.

SUMMARY OF THE INVENTION

Accordingly, the present invention has been made keeping in mind the above problems occurring in the prior art, and the present invention provides a dual face package which can be manufactured in a simple way such that an upper substrate serving as a resin sealing layer is prepared in advance and the upper substrate is attached to a semiconductor substrate through an adhesive layer disposed therebetween, and a method of manufacturing the dual face package.

In an aspect, the present invention provides a dual face package, including: a semiconductor substrate including a through-electrode connected to a die pad disposed on one side of the semiconductor substrate, and a lower redistribution layer disposed on another side thereof and connected to the through-electrode; an insulating layer including a post electrode connected to the through-electrode, and an upper redistribution layer disposed on one side thereof and connected to the post electrode; and an adhesive layer disposed on the one side of the semiconductor substrate so as to attach the insulating layer to the semiconductor substrate such that the through-electrode is connected to the post electrode.

The adhesive layer may be disposed on the one side of the semiconductor substrate such that the through-electrode is exposed therethrough.

The adhesive layer may be made of conductive adhesive such as anisotropic conductive film.

The dual face package may further include an external connecting terminal disposed on the redistribution layer.

In another aspect, the present invention provides a method of manufacturing a dual face package, including: (A) preparing an upper substrate composed of an insulating layer including a post via-hole; (B) forming a filled electrode in a semiconductor substrate, the filled electrode being connected to a die pad; (C) applying an adhesive layer on one side of the semiconductor substrate including the filled electrode, and attaching the upper substrate to the semiconductor substrate; (D) cutting another side of the semiconductor substrate in a thickness direction, thus making the filled electrode into a through-electrode; and (E) forming a post electrode in the post via-hole, forming an upper redistribution layer connected to the post electrode of the semiconductor substrate, and forming a lower redistribution layer connected to the through-electrode on the other side of the semiconductor substrate.

In the method, (A) preparing the upper substrate may include: (A1) preparing an upper mold part having a flat surface and a lower mold part having a protrusion for formation of a post via-hole; (A2) applying insulating material on the lower mold part and pressing the upper mold part; and (A3) removing the upper and lower mold parts, thus providing the upper substrate composed of the insulating layer including the post via-hole.

The upper substrate may be prepared through a printing process using a mask having an opening for formation of the post via-hole.

In the method, (B) forming the filled electrode may include: (B1) forming a filled via-hole in the center of the die pad, the filled via-hole being smaller than the die pad; and (B2) forming a filled electrode in the filled via-hole.

In (C) applying the adhesive layer, the adhesive layer may be applied to the one side of the semiconductor substrate such that the filled electrode is exposed through the adhesive layer.

In (C) applying the adhesive layer, the adhesive layer may be made of conductive adhesive such as anisotropic conductive film (ACF).

The method may further include, after (E) forming the post electrode, (F) forming an external connecting terminal on one of the upper and lower redistribution layers.

In a further aspect, the present invention provides a method of manufacturing a dual face package, including: (A) preparing an upper substrate composed of an insulating layer including a post electrode and an upper redistribution layer disposed on one side of thereof; (B) forming a filled electrode in a semiconductor substrate, the filled electrode being connected to a die pad; (C) applying an adhesive layer on one side of the semiconductor substrate including the filled electrode, and attaching the upper substrate to the semiconductor substrate; (D) cutting another side of the semiconductor substrate in a thickness direction, thus making the filled electrode into a through-electrode; and (E) forming a lower redistribution layer on the other side of the semiconductor substrate, the lower redistribution layer being connected to the through-electrode.

In the method, (A) preparing the upper substrate may include: (A1) forming a seed layer on one side of a support; (A2) forming a resist layer on the seed layer and forming an opening in the resist layer; (A3) forming a post electrode in the opening; (A4) removing the resist layer and forming an insulating layer on the support; and (A5) removing the support, thus providing the upper substrate.

In the method, (B) forming the filled electrode may includes: (B1) forming a filled via-hole in the center of the die pad, the filled via-hole being smaller than the die pad; and (B2) forming a filled electrode in the filled via-hole.

In (C) applying the adhesive layer, the adhesive layer may be applied to the one side of the semiconductor substrate such that the filled electrode is exposed through the adhesive layer.

In (C) applying the adhesive layer, the adhesive layer may be made of conductive adhesive such as anisotropic conductive film (ACF).

The method may further include, after (E) forming the lower redistribution layer, (F) forming an external connecting terminal on one of the upper and lower redistribution layers.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to best describe the method he or she knows for carrying out the invention.

In the following detailed description, it should be noted that the terms "first", "second" and the like are not intended to indicate a specific amount, sequence or significance but are intended to differentiate constituent elements. Furthermore, concerning the designations of reference numerals, it should be noted that the same reference numerals are used throughout the different drawings to designate the same or similar components. Also, in the description of the present invention, when it is considered that the detailed description of a related prior art may obscure the gist of the present invention, such a detailed description is omitted.

Hereinafter, embodiments of the present invention will be described in greater detail with reference to the following drawings.

Dual Face Package

Structure

Figure 1:
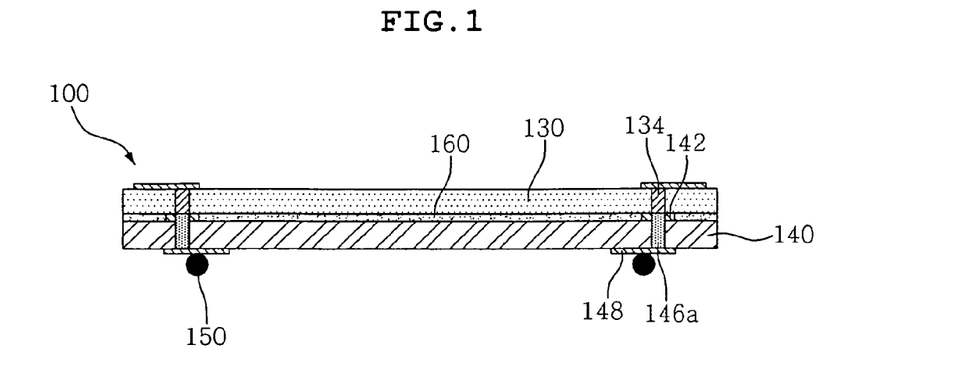
FIG. 1 is a cross-sectional view of a dual face package according to an embodiment of the present invention.

FIG. 1 is a cross-sectional view of a dual face package according to an embodiment of the present invention. Referring to FIG. 1, the dual face package 100 according to the embodiment of the present invention is described hereinafter.

As shown in FIG. 1, the dual face package 100 according to the embodiment of the present invention is constructed such that an upper substrate 120 is attached to a semiconductor substrate 140 using an adhesive layer 160 disposed therebetween.

The semiconductor substrate 140 includes through-electrodes 146a which are connected to die pads on one side of the semiconductor substrate 140 and are formed through the semiconductor substrate 140. Disposed on the other side of the semiconductor substrate 140 are lower redistribution layers 148.

The upper substrate 120 is configured such that post electrodes are formed in an insulating layer 130 and upper redistribution layers 236 are disposed on one side of the insulating layer 130 such that an end of each of the upper redistribution layers 136 is connected to the post electrode 134. At this point, the post electrodes 134 are electrically connected to the through-electrodes of the semiconductor substrate 140, and the adhesive layer 160 is disposed between the semiconductor substrate 140 and the upper substrate 120 so as to attach the upper substrate 120 to one side of the semiconductor substrate 140. In this regard, the adhesive layer 160 disposed on one side of the semiconductor substrate 140 may be composed of conductive adhesive such as an anisotropic conductive film (ACF) with the exception of the region at which filled electrodes are formed.

In the dual face package 100 which is constructed in the above-described manner, external connecting terminals 150, such as solder balls may be formed on the upper redistribution layers 136 and/or the lower redistribution layers 148.

Process of Manufacturing a Dual Face Package

First Embodiment

Figure 2:
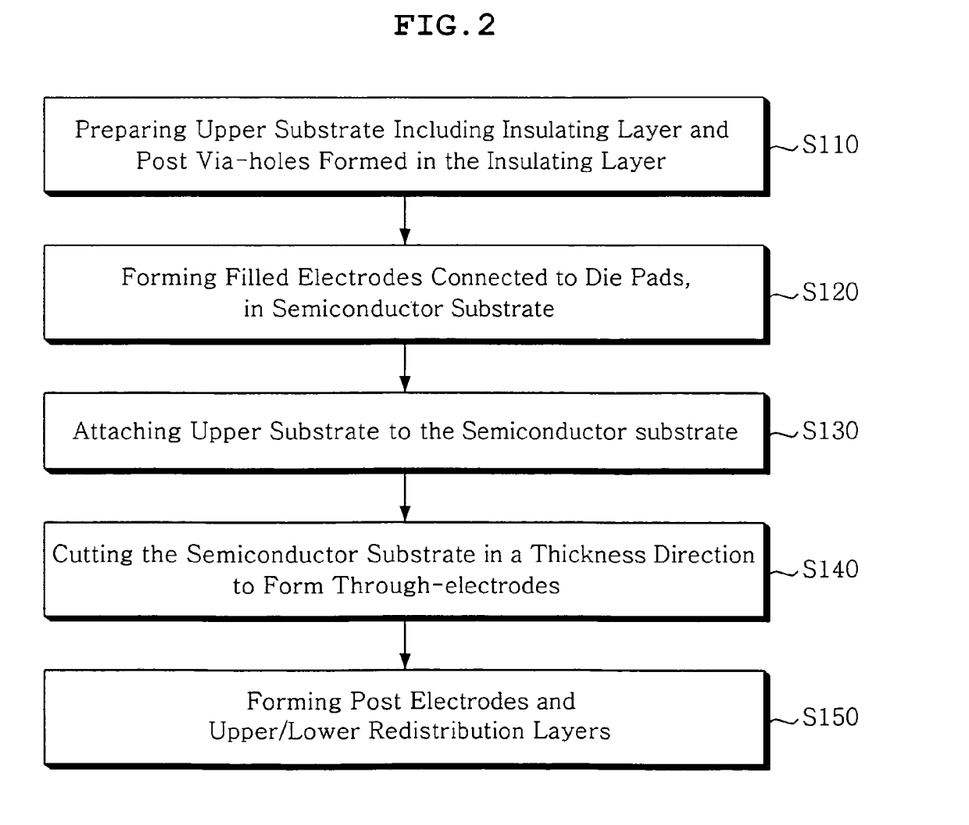
FIG. 2 is a flow chart showing a process of manufacturing a dual face package according to a first embodiment of the present invention.

FIG. 2 is a flow chart showing a process of manufacturing a dual face package according to a first embodiment of the present invention, and FIGS. 3 to 15 are cross-sectional views showing the process of manufacturing a dual face package according to the first embodiment of the present invention.

Referring to FIGS. 2 to 15, the process of manufacturing a dual face package according to the first embodiment of the present invention is described.

As shown in FIG. 2, the process of manufacturing a dual face package according to the first embodiment includes preparing an upper substrate which includes an insulating layer and post via-holes formed in the insulating layer (S110), forming filled electrodes connected to die pads, in a semiconductor substrate (S120), attaching the upper substrate to the semiconductor substrate (S130), cutting the semiconductor substrate in a thickness direction to form through-electrodes (S140), and forming post electrodes and upper and lower redistribution layers (S150).

Hereinafter, respective operations of the process are described in detail with reference to the corresponding drawings.

Figure 3:
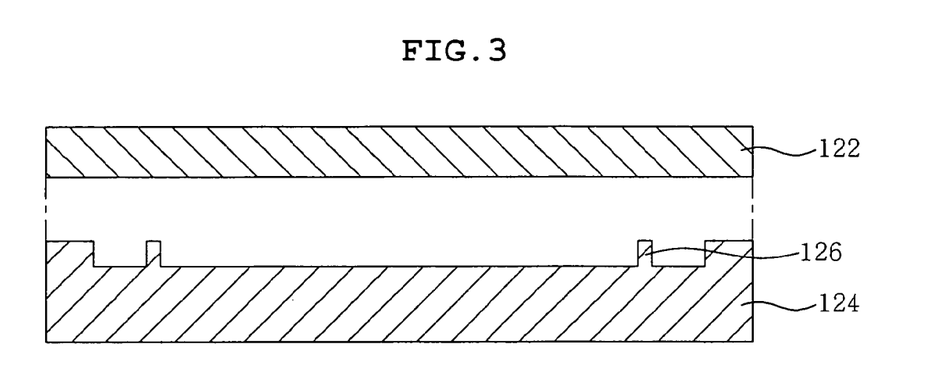
FIGS. 3 to 15 are cross-sectional views showing the process of manufacturing a dual face package according to the first embodiment of the present invention.
Figure 4:
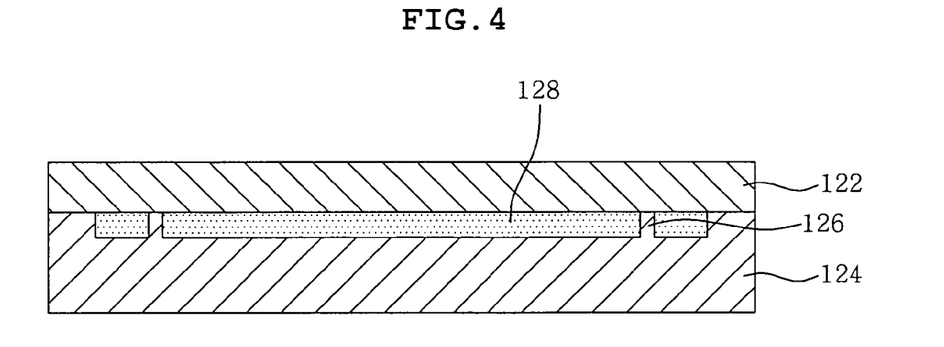
Figure 5:
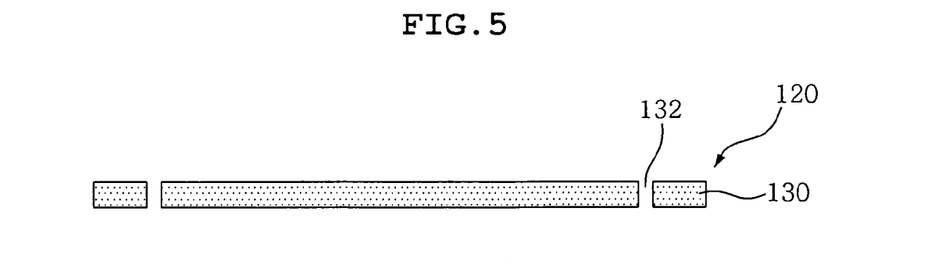

In the operation (S110), an upper substrate 120, which is composed of an insulating layer 130 and post via-holes 132 formed in the insulating layer 130 for the formation of post electrodes, is prepared. The upper substrate 120 is produced through, for example, a molding process as shown in FIGS. 3 to 5. FIGS. 3 to 5 are drawings showing a process corresponding to the operation (S110).

As shown in FIG. 3, an upper mold part 122 having a flat surface and a lower mold part 124 including protrusions 126 for the formation of post via-holes are prepared.

At this point, the protrusions 126 of the lower mold part 124 have a pattern corresponding to the post via-holes 132, and the lower mold part includes a peripheral wall defining a predetermined space for accommodating insulating material therein.

As shown in FIG. 4, insulating material 128 is applied to the lower mold part 124, and is then compressed by the upper mold part 122 or imprinted.

At this time, the insulating material 128 may be applied using spin coating, droplet dispensing or spraying. Needless to say, application of the insulating material 128 using any other known process also falls within the scope of the present invention.

The insulating material 128 may include thermosetting resin such as vinyl ester resin, unsaturated polyester resin, maleimide resin, polycyanate resin, epoxy resin, phenol resin and vinyl benzene compound, thermoplastic resin such as polyetherimide resin, polyether sulfone resin, and dicyclopentadiene resin, or epoxy molding compound (EMC). In this operation, the insulating material 128 may be applied in a semi-cured state.

As shown in FIG. 5, the upper mold part 122 and the lower mold part 124 are removed, with the result that the upper substrate 120, which is composed of the insulating layer 130 with the post via-holes 132 formed therein, is prepared. In this case, an additional operation of drying the semi-cured upper substrate 120 to completely cure the substrate may be further conducted.

Alternatively, the upper substrate 120 including post via-holes 132 formed therein may also be produced through a printing process of printing insulating material 128 through a mask (not shown) having openings for the formation of post via-holes.

Figure 6:
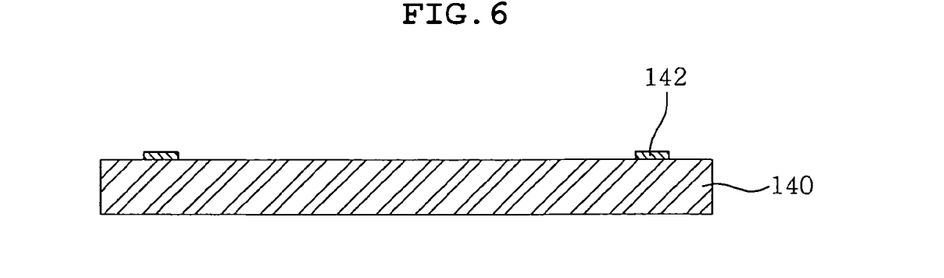
Figure 7:
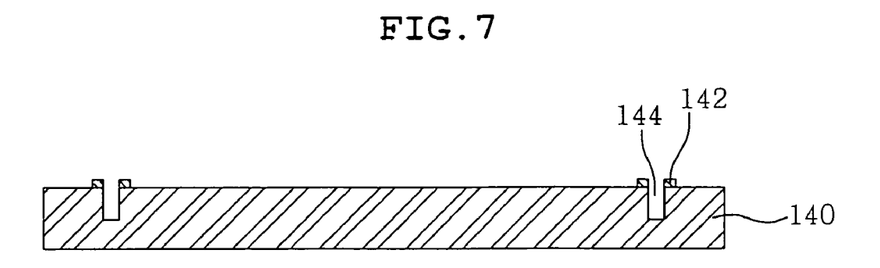
Figure 8:
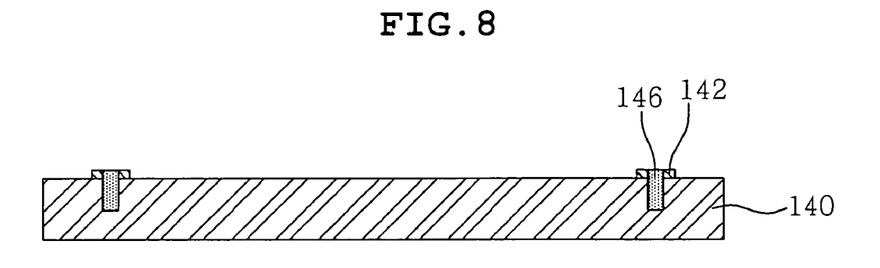

In the operation (S120), filled electrodes 146 connected to die pads 142 are formed in the semiconductor substrate 140. At this point, the filled electrodes 146 are formed through, for example, a process as shown in FIGS. 6 to 8. FIGS. 6 to 8 are drawings showing a process corresponding to the operation (S120).

As shown in FIG. 6, a semiconductor substrate 140, which is composed of silicon chip body including an integrated circuit (not shown) therein and die pads 142 disposed on the silicon chip body and electrically connected to the integrated circuit, is prepared.

As shown in FIG. 7, filled via-holes 144 are formed in the semiconductor substrate 140 including portions (the center portions) of the die pads 142.

At this point, the filled via-holes 144 may be formed so as to have a depth less than the thickness of the semiconductor substrate 140. The reason for this is because there is no need to form the filled via-holes having an excessive depth since the semiconductor substrate 140 will be cut in a thickness direction in the operation (S140).

The filled via-holes 144 may be formed through a laser drilling process or a reactive ion etching (RIE).

The laser drilling process is conducted in such a way as to form a via-hole smaller than the die pad 142 in the center portion of the die pad 142. In the case of adopting the laser drilling process, it is advantageous in that there is no necessity for provision of a mask and photolithography process, micro holes having a high aspect ratio are formed at high speed, and a current process of manufacturing the semiconductor substrate is not restricted at all. In addition, the laser drilling process may be applied to the formation of various materials such as a metal layer, an oxidized film, a nitride film and a protective polymer as well as that of the silicon material.

The RIE process is conducted in such as way as to etch the die pad 142 through a mask having a circular pattern so as to form a via-hole smaller than the die pad 142. In the case of adopting the RIE process, although holes having a high aspect ratio are precisely formed, additional costs are required for the mask and the photolithography process and the design of the semiconductor chip must be changed for the sake of arrangement of the holes.

As shown in FIG. 8, internal surfaces of the filled via-holes 144 are oxidized, and plating film (for example, copper) is applied into the filled via-holes 144 to form filled electrodes 146. In this regard, it should be noted that the formation of the filled electrodes 146 through a plating process is no more than an example and the filled electrodes 146 may be formed through any other process. In one alternative process, conductive particles are blown into the filled via-holes 144 in an inkjet manner and charged therein, and then the charged conductive particles are cured using heat treatment. In another alternative process, metal material such as tungsten, titanium, nickel, aluminum or alloy thereof is charged into the filled via-holes 144 through chemical vapor deposition (CVD).

Figure 9:
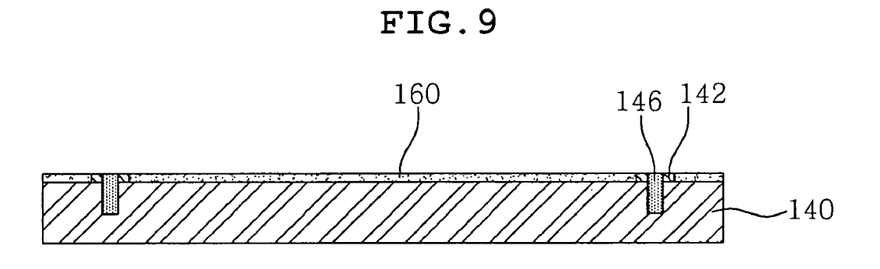
Figure 10:
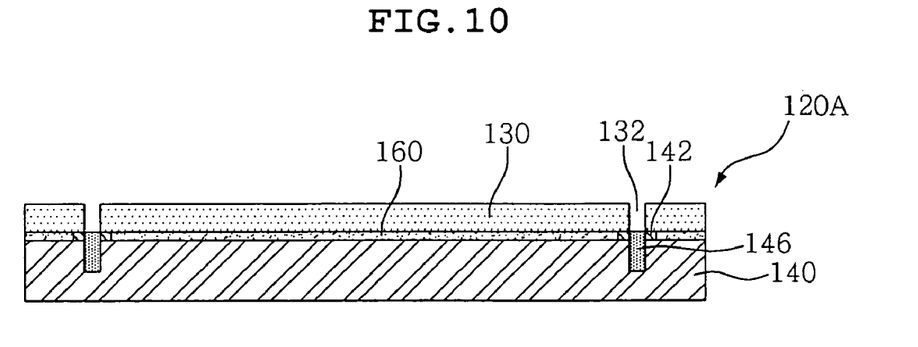

In the operation (S130), an adhesive layer 160 is applied to one side of the semiconductor substrate 140, and the upper substrate 120 is attached to the semiconductor substrate 140 by means of the adhesive layer 160 disposed therebetween. FIGS. 9 and 10 are drawings showing a process corresponding to the operation (S130).

As shown in FIG. 9, the adhesive layer 160 is applied to one side of the semiconductor substrate 140 on which the filled electrodes 146 are formed, with the exception of the areas corresponding to the filled electrodes 146.

Subsequently, as shown in FIG. 10, the upper substrate 120 having via-holes 132 for the formation of post electrodes is positioned such that the via-holes 132 of the upper substrate 120 are aligned with the respective corresponding filled electrodes 146, and then the upper substrate 120 is attached to the semiconductor substrate 140 by means of the adhesive layer 160.

At this point, the adhesive layer 160 may include not only typical adhesive but also anisotropic conductive film (ACF).

Figure 11:
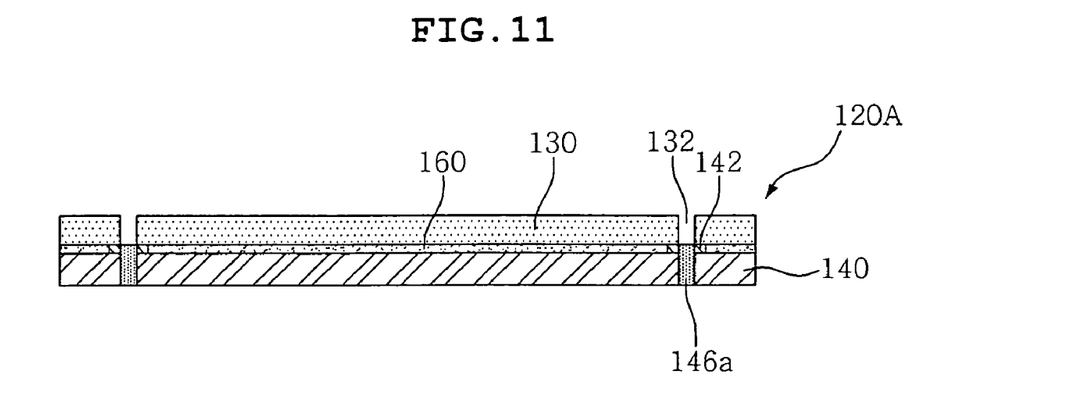

In the operation (S140), the filled electrodes 146 are made into through-electrodes 146a. FIG. 11 is a drawing showing a process corresponding to the operation (S140).

As shown in FIG. 11, the other side of the semiconductor substrate 140 is cut in a thickness direction, so that the filled electrodes 146 are exposed through the other side of the semiconductor substrate 140. In this operation, the cutting of the semiconductor substrate 140 in a thickness direction may be conducted through, for example, a lapping process.

Figure 12:
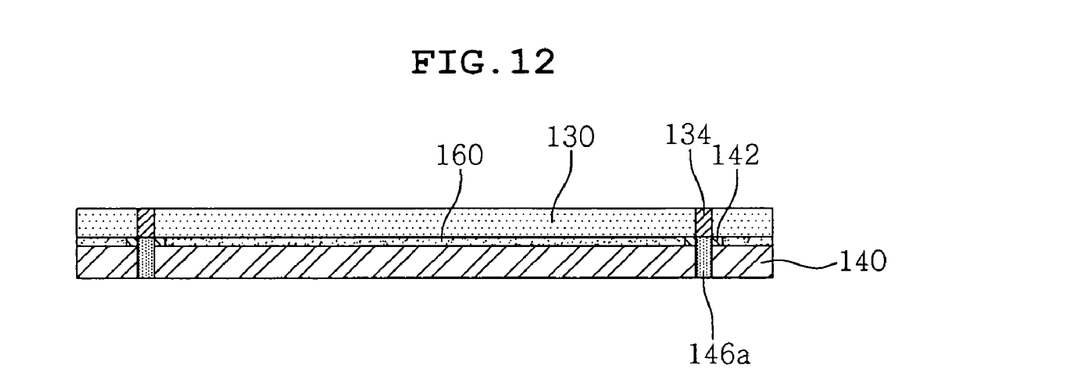
Figure 13:
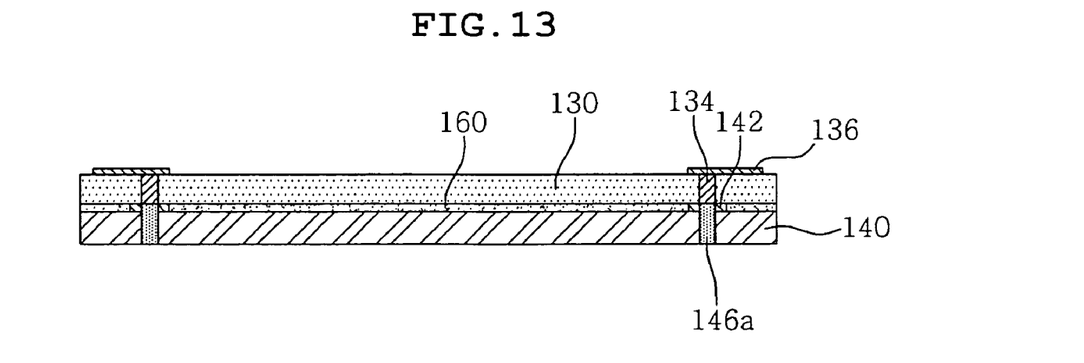
Figure 14:
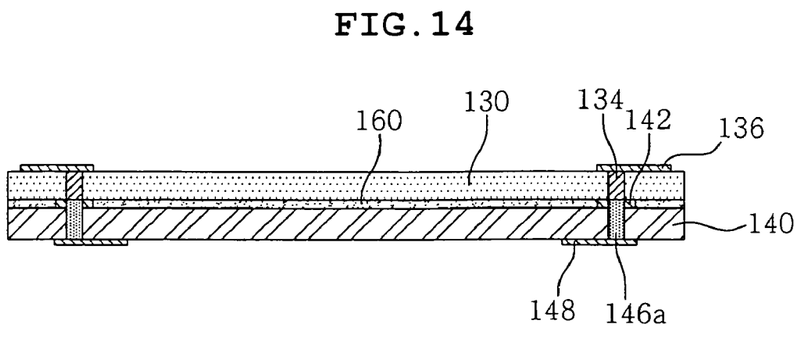

In an operation (S150), post electrodes 134 and redistribution layers 136 and 148 are formed. The post electrodes 134 and the redistribution layers 136 and 148 are formed through, for example, a process as shown in FIGS. 12 to 14. FIGS. 12 to 14 are drawings showing a process corresponding to the operation (S150).

As shown in FIG. 12, plating film (for example, copper film) is applied into the post via-holes 132 formed in the upper substrate 120 to form the post electrodes 134.

At this time, since the post electrodes 134 are applied into the post via-holes 132 to be connected to the filled electrodes 146 of the semiconductor substrate 140, the post electrodes 134 function not only to electrically connect the semiconductor substrate 140 to the upper substrate 120 but also to realize the adhesion therebetween.

As shown in FIG. 13, the upper redistribution layers 136 are formed on the upper substrate 120 such that each of the upper redistribution layers 136 is connected at one end to the corresponding post electrode 134. At this point, the other end of the upper redistribution layer 136 may be provided with a connecting pad (not shown) for the connection with a solder ball or an external connecting terminal. In this regard, the upper redistribution layers 136 may be made of aluminum (Al), copper (Cu), Nickel (Ni), Gold (Au) or the like.

As shown in FIG. 14, the lower redistribution layers 148 are formed on the other side of the semiconductor substrate 140 such that each of the lower redistribution layers 148 is connected at one end to the through-electrode 146a. At this point, the other end of the lower redistribution layer 148 may be provided with a connecting pad (not shown) for the connection with a solder ball or an external connecting terminal. In this regard, like the upper redistribution layers 136, the lower redistribution layers 148 may also be made of aluminum (Al), copper (Cu), Nickel (Ni), Gold (Au) or the like.

Figure 15:
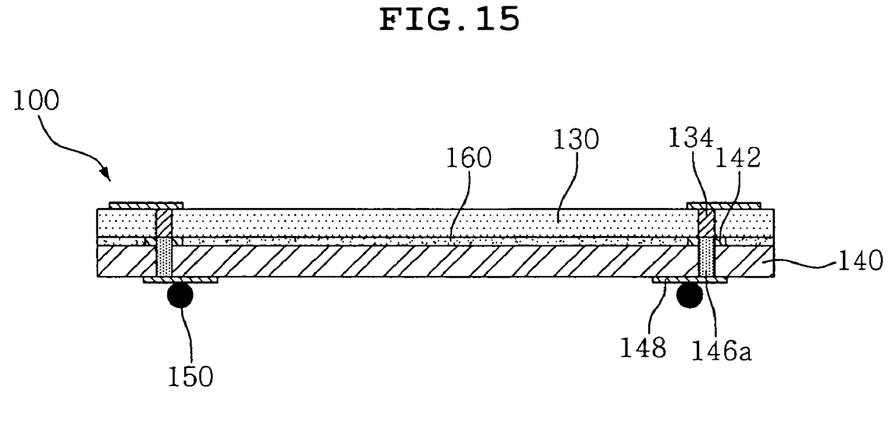

As shown in FIG. 15, external connecting terminals 150 such as solder balls are formed on either the upper redistribution layers 136 or the lower redistribution layers 148. Although FIG. 15 shows the external connecting terminals 150 being formed only on the lower redistribution layers 148, the present invention is not limited to this configuration.

Process of Manufacturing a Dual Face Package

Second Embodiment

Figure 16:
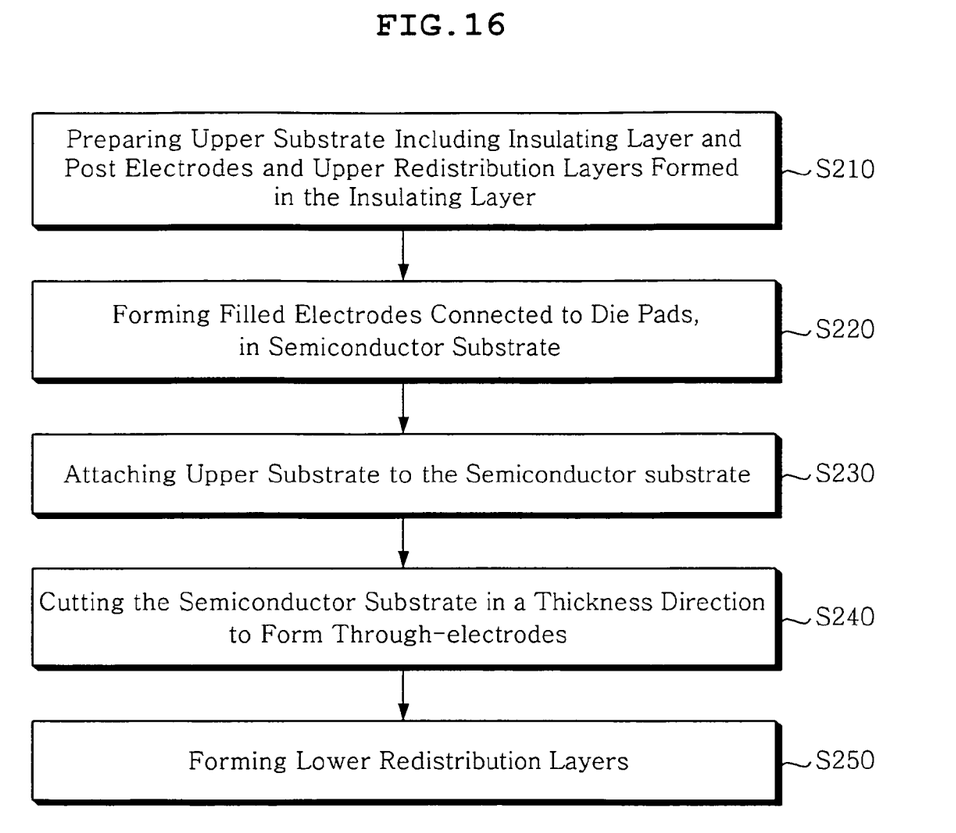
FIG. 16 is a flow chart showing a process of manufacturing a dual face package according to a second embodiment of the present invention.

FIG. 16 is a flow chart showing a process of manufacturing a dual face package according to a second embodiment of the present invention, and FIGS. 17 to 30 are cross-sectional views showing the process of manufacturing a dual face package according to the second embodiment of the present invention.

Referring to FIGS. 16 to 30, the process of manufacturing a dual face package according to the second embodiment of the present invention is described. In the following description, detailed descriptions of components similar to or identical to the components of the previous, first embodiment will be omitted.

As shown in FIG. 16, the process of manufacturing a dual face package according to the second embodiment includes preparing an upper substrate which includes an insulating layer and post electrodes and upper redistribution layers formed in the insulating layer (S210), forming in a semiconductor substrate filled electrodes connected to die pads (S220), attaching the upper substrate to the semiconductor substrate (S230), cutting the semiconductor substrate in a thickness direction to form through-electrodes (S240), and forming lower redistribution layers (S250).

Hereinafter, respective operations of the process are described in detail with reference to the corresponding drawings.

In the operation (S210), an upper substrate 220, which is composed of an insulating layer 230, post electrodes 234 formed in the insulating layer 230 and upper redistribution layers 236 disposed on one side of the insulating layer 230 and connected to the post electrodes 234, is prepared. The upper substrate 220 is produced through, for example, a process as shown in FIGS. 17 to 22. FIGS. 17 to 22 are drawings showing a process corresponding to the operation (S210).

Figure 17:
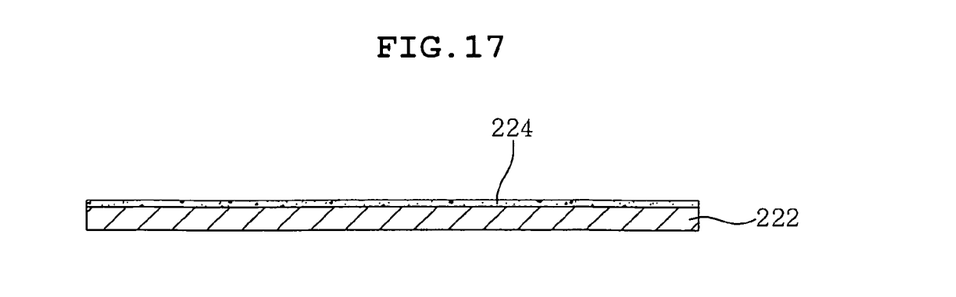
FIGS. 17 to 30 are cross-sectional views showing the process of manufacturing a dual face package according to the second embodiment of the present invention.

As shown in FIG. 17, a seed layer 224 is formed on a support 222.

At this point, the support 222 may include, for example, a resin layer having a predetermined strength, and the seed layer 224 may include an electroless plating layer formed on the resin layer through an electroless plating process.

Figure 18:
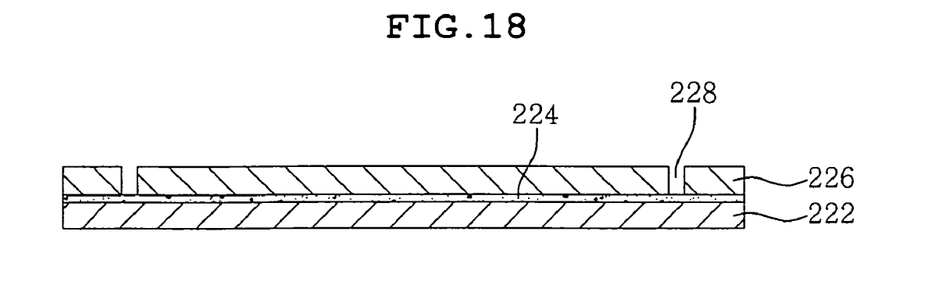

As shown in FIG. 18, a resist layer 226 such as photoresist or dry film is formed on the seed layer 224, and openings 228 for the formation of post electrodes 234 are formed in the resist layer 226.

Figure 19:
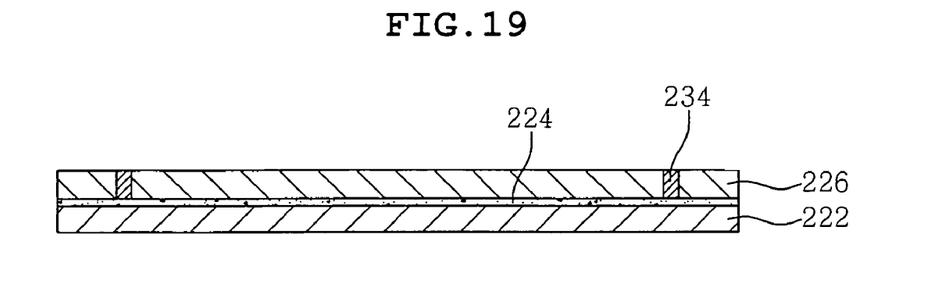

As shown in FIG. 19, plating film (for example, copper film) is applied into the openings 228 to form the post electrodes 234. In this regard, it should be noted that the formation of the post electrodes 234 through a plating process is no more than an example and the post electrodes 234 may be formed through any other process. For example, conductive particles blown into the openings 228 in an inkjet manner and charged therein, and then the charged conductive particles are cured using heat treatment, or metal material such as tungsten, titanium, nickel, aluminum or alloy thereof is charged into the openings 228 through chemical vapor deposition (CVD).

Figure 20:
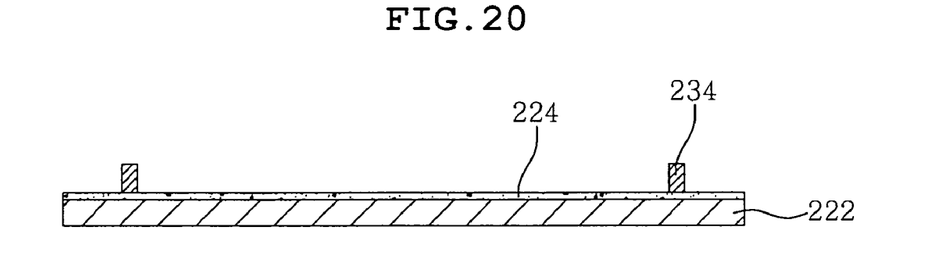

Subsequently, as shown in FIG. 20, the seed layer 226 is removed, and then insulating material is applied to the seed layer 224 to form an insulating layer 230.

At this point, the insulating layer 230 may be formed on the seed layer 224 so as to have the same thickness as that of the post electrodes 234, using spin coating, droplet dispensing or spraying. Needless to say, application of the insulating layer 230 using any other known process also falls within the scope of the present invention.

The insulating layer 230 may include thermosetting resin such as vinyl ester resin, unsaturated polyester resin, maleimide resin, polycyanate resin, epoxy resin, phenol resin and vinyl benzene compound, thermoplastic resin such as polyetherimide resin, polyether sulfone resin, and dicyclopentadiene resin, or epoxy molding compound (EMC). In this operation, the insulating material may be applied in a semi-cured state.

Figure 21:
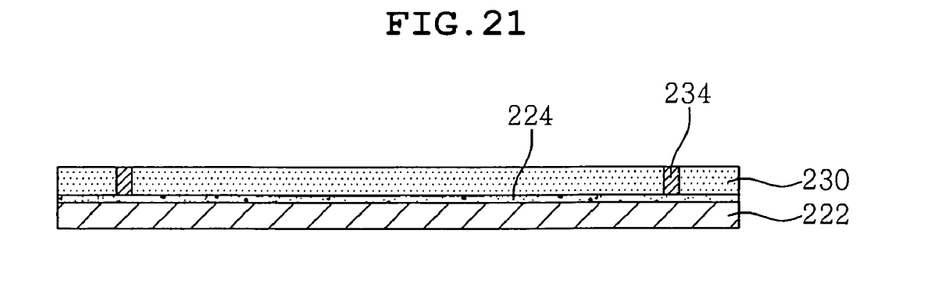

As shown in FIG. 21, the support 222 and the seed layer 224 are removed, thus providing the insulating layer 230 including the post electrodes 234 formed thereon.

Figure 22:
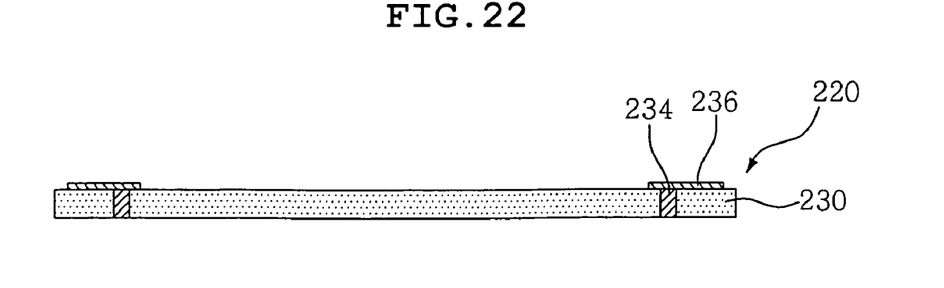

As shown in FIG. 22, upper redistribution layers 236 are formed on one side of the insulating layer 230 such that each of the upper redistribution layers 236 is connected at one end to the corresponding post electrode 234. At this point, the other end of the upper redistribution layer 236 may be provided with a connecting pad (not shown) for the connection with a solder ball or an external connecting terminal. In this regard, the upper redistribution layers 236 may be made of aluminum (Al), copper (Cu), Nickel (Ni), Gold (Au) or the like.

This embodiment is differentiated from the previous first embodiment in that the upper substrate 220 includes the upper redistribution layers 236 formed thereon.

Figure 23:
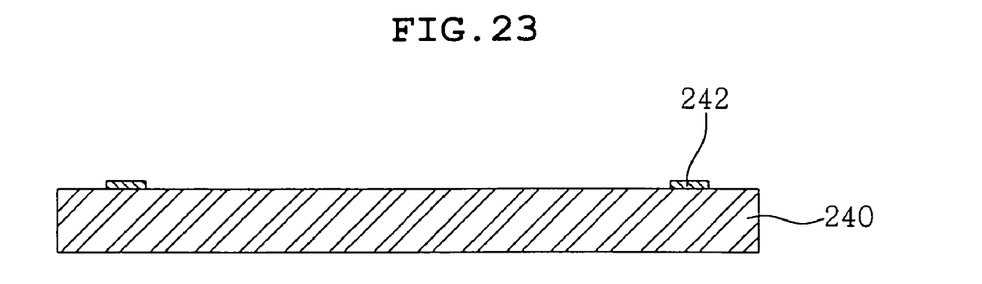
Figure 24:
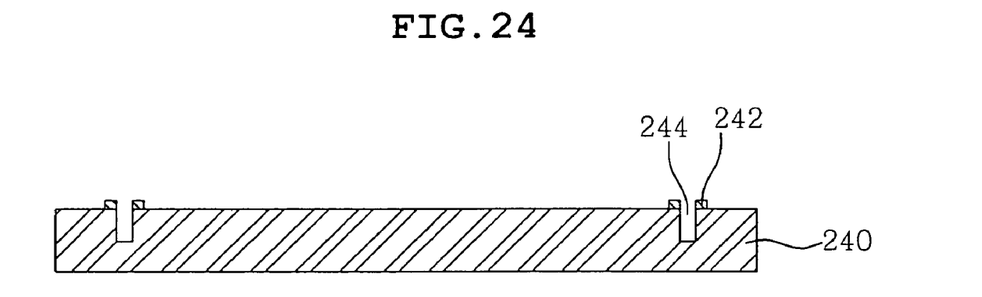
Figure 25:
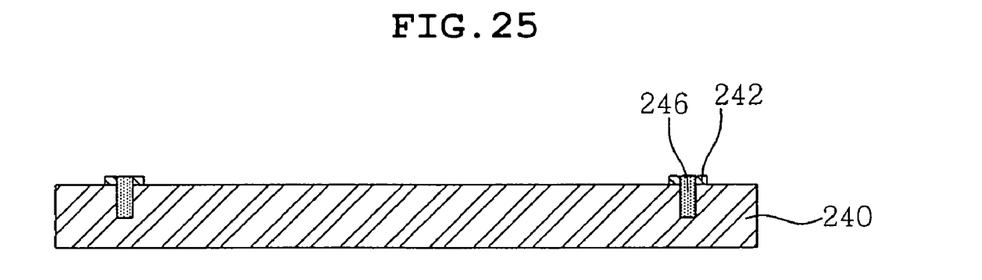

In the operation (S220), filled electrodes 246 connected to die pads 242 are formed in the semiconductor substrate 240. At this point, the filled electrodes 246 are formed through, for example, a process as shown in FIGS. 23 to 25. FIGS. 23 to 25 are drawings showing a process corresponding to the operation (S220). Since the operation (S220) is substantially identical to the operation (S120) of the first embodiment shown in FIGS. 6 to 8, the detailed description thereof will be omitted.

Figure 26:
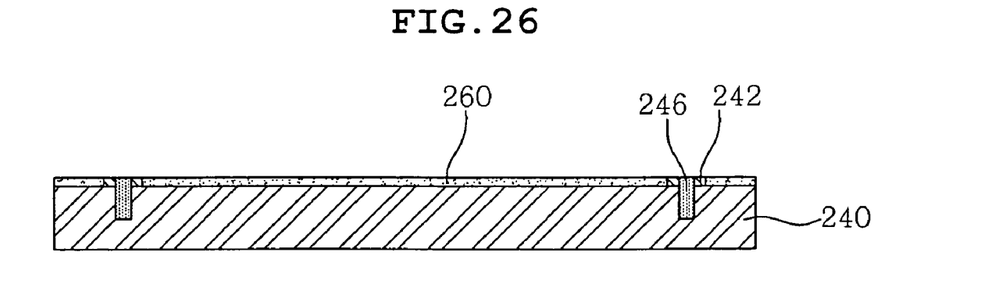
Figure 27:
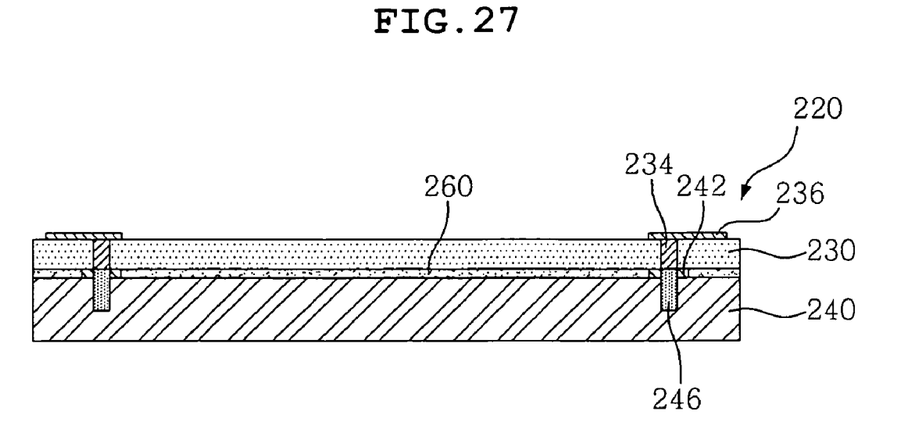

In the operation (S230), an adhesive layer 260 is applied to one side of the semiconductor substrate 240, and the upper substrate 220 is attached to the semiconductor substrate 240 by means of the adhesive layer 260 disposed therebetween, through a process shown in FIGS. 26 and 27. FIGS. 26 and 27 are drawings showing the process corresponding to the operation (S230). Since the operation (S230) is substantially identical to the operation (S130) of the first embodiment shown in FIGS. 9 and 10, the detailed description thereof will be omitted.

Figure 28:
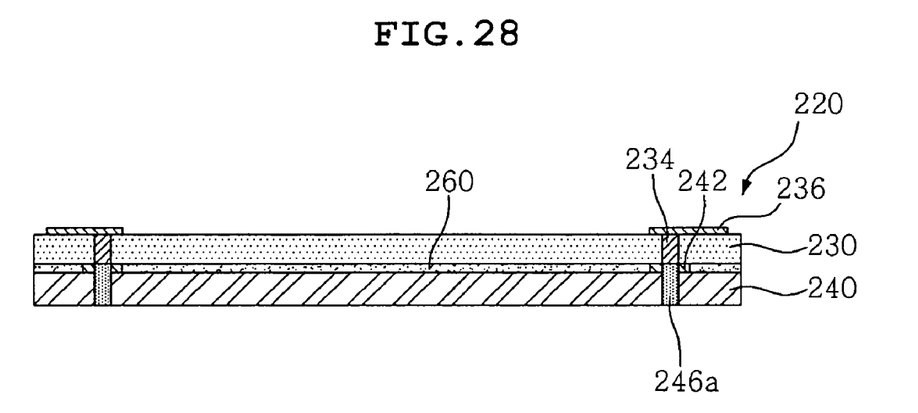

In the operation (S240), the filled electrodes 246 are made into through-electrodes 246a through a process shown in FIG. 28. FIG. 28 is a drawing showing the process corresponding to the operation (S240). Since the operation (S240) is substantially identical to the operation (S140) of the first embodiment shown in FIG. 10, the detailed description thereof will be omitted.

Figure 29:
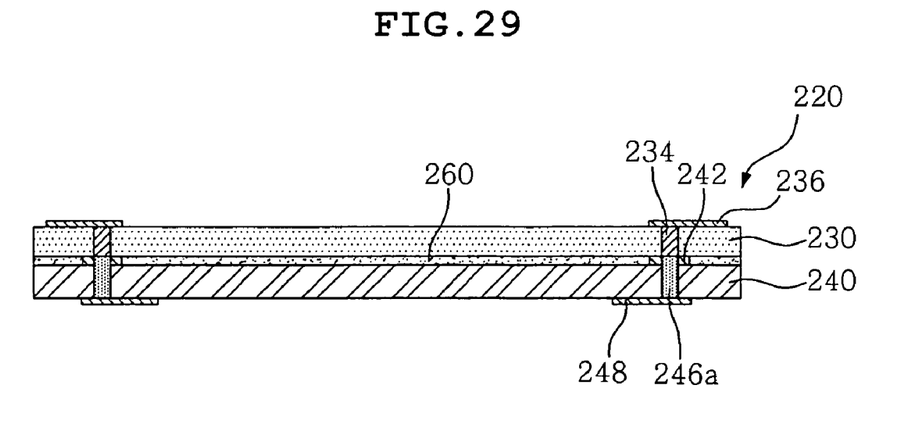

In the operation (S250), lower redistribution layers 248 are formed on the semiconductor substrate 240 through a process shown in FIG. 29. FIG. 29 is a drawing showing the process corresponding to the operation (S250).

As shown in FIG. 29, the lower redistribution layers 248 are formed on the other side of the semiconductor substrate 240 such that each of the lower redistribution layers 248 is connected at one end to the through-electrode 246a. At this point, the other end of the lower redistribution layer 248 may be provided with a connecting pad (not shown) for connection with a solder ball or an external connecting terminal. In this regard, like the upper redistribution layers 236, the lower redistribution layers 248 may also be made of aluminum (Al), copper (Cu), Nickel (Ni), Gold (Au) or the like.

Figure 30:
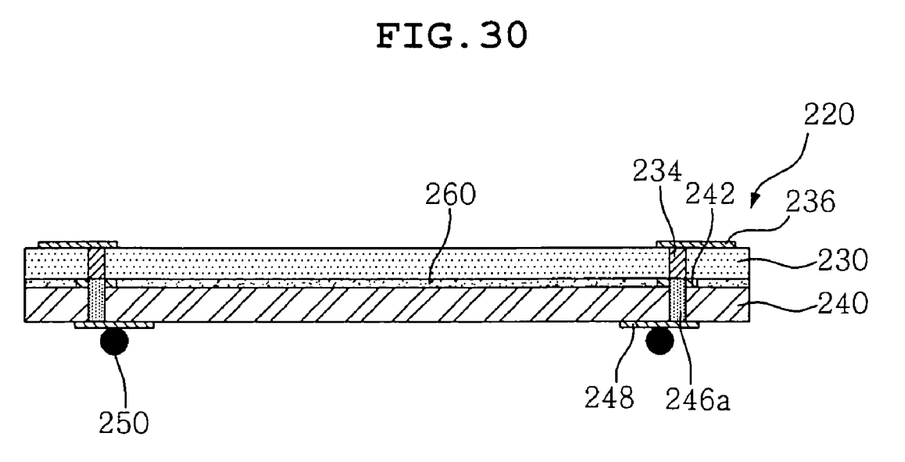

As shown in FIG. 30, external connecting terminals 250 such as solder balls are formed on either the upper redistribution layers 236 or the lower redistribution layers 248. Although FIG. 30 shows the external connecting terminals 250 being formed only on the lower redistribution layers 248, the present invention is not limited to this configuration.

Although this embodiment has been described as being configured such that the upper substrate including the upper redistribution layers 236 formed thereon is attached to the semiconductor substrate 240 by means of the adhesive layer 260 disposed therebetween, the embodiment may also be conducted in a manner such that the upper substrate 220 on which the upper redistribution layers 236 are not formed in advance is attached to the semiconductor substrate 240 and then the upper redistribution layers 236 are formed on the upper substrate 220 in the operation (S250) of forming the lower redistribution layers 248.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. A dual face package, comprising:
a semiconductor substrate, having a flat surface, including a through-electrode connected to a die pad disposed on one side of the semiconductor substrate, and a lower redistribution layer disposed on another side of the semiconductor substrate and connected to the through-electrode;
a resin insulating layer including a post electrode connected to the through-electrode, and an upper redistribution layer disposed on one side of the resin insulating layer and directly connected to the post electrode, the post electrode formed on the inside of the resin insulating layer; and
an adhesive layer disposed on the one side of the semiconductor substrate so as to attach the resin insulating layer to the semiconductor substrate such that the through-electrode is connected to the post electrode.

2. The dual face package according to claim 1, wherein the adhesive layer is disposed on the one side of the semiconductor substrate such that the through-electrode is exposed therethrough.

3. The dual face package according to claim 1, wherein the adhesive layer is made of a conductive adhesive such as an anisotropic conductive film.

4. The dual face package according to claim 1, further comprising an external connecting terminal disposed on the upper redistribution layer, the lower redistribution layer, or both the lower and upper redistribution layers.

5. A dual face package, comprising:
a semiconductor substrate, having a flat surface, including a through-electrode connected to a die pad disposed on one side of the semiconductor substrate, and a lower redistribution layer disposed on another side of the semiconductor substrate and connected to the through-electrode;
a resin insulating layer including a post electrode connected to the through-electrode, and an upper redistribution layer disposed on one side of the resin insulating layer and directly connected to the post electrode, the post electrode formed on the inside of the resin insulating layer, the resin insulation layer being a resin sealing layer; and an adhesive layer disposed on the one side of the semiconductor substrate so as to attach the resin insulating layer to the semiconductor substrate such that the through-electrode is connected to the post electrode.

6. The dual face package according to claim 5, wherein the adhesive layer is disposed on the one side of the semiconductor substrate such that the through-electrode is exposed therethrough.

7. The dual face package according to claim 5, wherein the adhesive layer is made of a conductive adhesive such as an anisotropic conductive film.

8. The dual face package according to claim 5, further comprising an external connecting terminal disposed on the upper redistribution layer, the lower redistribution layer or both the lower and upper redistribution layers.

* * * * *